United States Patent
Peng et al.

(10) Patent No.: US 9,704,451 B1
(45) Date of Patent: Jul. 11, 2017

(54) SHIFT REGISTER CELL, SHIFT REGISTER, GATE DRIVING CIRCUIT AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Yuhang Peng, Beijing (CN); Xin Jin, Beijing (CN); Wenbin Yang, Beijing (CN); Pengyu Liao, Beijing (CN); Chao Tan, Beijing (CN); Junxi Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 15/103,983

(22) PCT Filed: Jan. 21, 2016

(86) PCT No.: PCT/CN2016/071545
§ 371 (c)(1),
(2) Date: Jun. 13, 2016

(87) PCT Pub. No.: WO2017/008488
PCT Pub. Date: Jan. 19, 2017

(30) Foreign Application Priority Data

Jul. 15, 2015 (CN) .......................... 2015 1 0415733

(51) Int. Cl.
*G09G 3/00* (2006.01)
*G09G 5/00* (2006.01)

(52) U.S. Cl.
CPC ..... *G09G 5/003* (2013.01); *G09G 2300/0871* (2013.01); *G09G 2310/0243* (2013.01);
(Continued)

(58) Field of Classification Search
USPC ......................................................... 345/100
See application file for complete search history.

(56) References Cited

U.S. PATENT DOCUMENTS

2003/0063079 A1 4/2003 Abe et al.

FOREIGN PATENT DOCUMENTS

| CN | 102804256 A | 11/2012 |
| CN | 103208251 A | 7/2013 |

(Continued)

OTHER PUBLICATIONS

ISR issued in international Chinese application No. PCT/CN2016/071545 dated Mar. 24, 2016.

*Primary Examiner* — Tony Davis
(74) *Attorney, Agent, or Firm* — Nath, Goldberg & Meyer; Joshua B. Goldberg

(57) ABSTRACT

The present invention provides a shift register, which comprises a first signal conversion module and a second signal conversion module, the first signal conversion module being connected to an start signal input terminal, a clock signal terminal, a high-level input terminal, a low-level input terminal and an input terminal of the second signal conversion module, respectively, and the second signal conversion module being connected to an output terminal of the first signal conversion module, the clock signal terminal, a signal output terminal, a high-level input terminal and a low-level input terminal, respectively. The present invention also provides a shift register, a gate driving circuit and a display device. The shift register cell provided by the present invention only needs a single-phase clock signal to perform (Continued)

control, thereby simplifying the structure of the shift register cell.

16 Claims, 3 Drawing Sheets

(52) U.S. Cl.
CPC .............. *G09G 2310/0267* (2013.01); *G09G 2310/0286* (2013.01); *G09G 2310/08* (2013.01); *G09G 2330/021* (2013.01)

(56) References Cited

FOREIGN PATENT DOCUMENTS

| | | |
|---|---|---|
| CN | 104505014 A | 4/2015 |
| CN | 104933982 A | 9/2015 |
| JP | 2002-132203 A | 5/2002 |

SHIFT REGISTER CELL, SHIFT REGISTER, GATE DRIVING CIRCUIT AND DISPLAY DEVICE

This is a National Phase Application filed under 35 U.S.C. 371 as a national stage of PCT/CN2016/071545 filed on Jan. 21, 2016, an application claiming the benefit to Chinese application No. 201510415733.6 filed on Jul. 15, 2015; the content of each of which is hereby incorporated by reference in its entirety.

FIELD OF THE INVENTION

The present invention relates to the field of display device, and specifically relates to a shift register cell, a shift register including the same, a gate driving circuit including the shift register and a display device including the gate driving circuit.

BACKGROUND OF THE INVENTION

In existing display devices, a gate line is usually provided with a scan signal by a gate driving circuit. The gate driving circuit includes a shift register which is formed by cascading a plurality of shift register cells. Generally, a shift register cell is driven by a clock signal having two or more phases, which increases the complexity of the shift register cell and is unfavorable to a narrow-bezel design of the display device.

Therefore, how to simplify the shift register cell becomes a technical problem to be solved in the art.

SUMMARY OF THE INVENTION

An object of the present invention is to provide a shift register cell, a shift register including the same, a gate driving circuit including the shift register and a display device including the gate driving circuit. The shift register has a simple structure.

To achieve the above object, as an aspect of the present invention, there is provided a shift register cell, which comprises a start signal input terminal, a clock signal terminal, a high-level input terminal, a low-level input terminal and a signal output terminal. The shift register cell further comprises a first signal conversion module and a second signal conversion module, where an input terminal of the first signal conversion module is connected to the start signal input terminal, an output terminal of the first signal conversion module is connected to an input terminal of the second signal conversion module, and an output terminal of the second signal conversion module is connected to the signal output terminal; the first signal conversion module is further connected to the clock signal terminal, the high-level input terminal and the low-level input terminal, respectively, and the second signal conversion module is further connected to the clock signal terminal, the high-level input terminal and the low-level input terminal, respectively, wherein one of a high-level signal inputted from the high-level input terminal and a low-level signal inputted from the low-level input terminal is an active signal, and the other is an inactive signal, and a clock signal is inputted from the clock signal terminal.

In a preprocessing stage where the clock signal is at a first level and the start signal is an inactive signal, an inactive signal is outputted to the second signal conversion module by the first signal conversion module, and an inactive signal is outputted by the second signal conversion module based on the inactive signal outputted by the first signal conversion module and the clock signal.

In a first signal writing stage where the clock signal is at a second level and the start signal is an active signal, an inactive signal is outputted to the second signal conversion module by the first signal conversion module, and an inactive signal is outputted by the second signal conversion module based on the inactive signal outputted by the first signal conversion module and the clock signal.

In a second signal writing stage where the clock signal is at the first level and the start signal is an active signal, an active signal is outputted to the second signal conversion module by the first signal conversion module, and an inactive signal is outputted by the second signal conversion module based on the active signal outputted by the first signal conversion module and the clock signal.

In a first output stage where the clock signal is at the second level and the start signal is an inactive signal, an active signal is outputted to the second signal conversion module by the first signal conversion module, and an active signal is outputted by the second signal conversion module based on the active signal outputted by the first signal conversion module and the clock signal.

In a second output stage where the clock signal is at the first level and the start signal is an inactive signal, an inactive signal is outputted to the second signal conversion module by the first signal conversion module, and an active signal is outputted by the second signal conversion module based on the inactive signal outputted by the first signal conversion module and the clock signal.

Preferably, the first signal conversion module is one of a positive-active latch and a negative-active latch, and the second signal conversion module is the other. When the clock signal is at the first level, the first signal conversion module is in a transparent mode and the second signal conversion module is in a holding mode, and when the clock signal is at the second level, the first signal conversion module is in a holding mode and the second signal conversion module is in a transparent mode.

Preferably, the first signal conversion module includes first and second inverters in series with each other, wherein the first inverter is capable of inverting, when the clock signal inputted from the clock signal terminal is a first-level signal, the start signal inputted thereto, and the second inverter is capable of inverting, when the clock signal inputted from the clock signal terminal is a first-level signal, a signal outputted from the first inverter; and the second signal conversion module includes third and fourth inverters in series with each other, the third inverter being in series with the second inverter, and when the clock signal inputted from the clock signal terminal is a second-level signal, the third inverter is capable of inverting a signal outputted from the second inverter, and the fourth inverter is capable of inverting a signal outputted from the third inverter.

Preferably, the first inverter includes a first transistor, a second transistor and a third transistor. A gate electrode of the first transistor and a gate electrode of the third transistor are connected to the start signal input terminal, a gate electrode of the second transistor is connected to the clock signal terminal, the first transistor is a P-type transistor, the third transistor is an N-type transistor, a first electrode of the first transistor is connected to the high-level input terminal, a second electrode of the first transistor is connected to a first electrode of the second transistor, a second electrode of the second transistor is connected to a first electrode of the third transistor, and a second electrode of the third transistor is connected to the low-level input terminal; and the second transistor is an N-type transistor, and the first electrode of the second transistor is an output terminal of the first inverter.

Preferably, the second inverter includes a fourth transistor, a fifth transistor and a sixth transistor, wherein the fourth transistor is a P-type transistor, and the fifth transistor and the sixth transistor are N-type transistors;

a first electrode of the fourth transistor is connected to the high-level input terminal, a second electrode of the fourth transistor is connected to a first electrode of the fifth transistor, a second electrode of the fifth transistor is connected to a first electrode of the sixth transistor, and a second electrode of the sixth transistor is connected to the low-level input terminal; and a gate electrode of the fifth transistor is connected to the clock signal terminal, a gate electrode of the fourth transistor and a gate electrode of the sixth transistor are connected to the output terminal of the first inverter, where the second electrode of the fourth transistor is an output terminal of the second inverter.

Preferably, the third inverter includes a seventh transistor, an eighth transistor and a ninth transistor, wherein the seventh transistor is a P-type transistor, and the ninth transistor is an N-type transistor;

a gate electrode of the seventh transistor and a gate electrode of the ninth transistor are both connected to the output terminal of the second inverter, and a gate electrode of the eighth transistor is connected to the clock signal terminal; and a first electrode of the seventh transistor is connected to the high-level input terminal, a second electrode of the seventh transistor is connected to a first electrode of the eighth transistor, a second electrode of the eighth transistor is connected to a first electrode of the ninth transistor, and a second electrode of the ninth transistor is connected to the low-level input terminal, where the second electrode of the seventh transistor is an output terminal of the third inverter, the eighth transistor is a P-type transistor, and the gate electrode of the eighth transistor is connected to the clock signal terminal.

Preferably, the fourth inverter includes a tenth transistor, an eleventh transistor and a twelfth transistor, wherein the tenth transistor and the eleventh transistor are P-type transistors, and the twelfth transistor is an N-type transistor;

gate electrodes of the tenth and twelfth transistors are connected to the output terminal of the third inverter, and a gate electrode of the eleventh transistor is connected to the clock signal terminal;

a first electrode of the tenth transistor is connected to the high-level input terminal, a second electrode of the tenth transistor is connected to a first electrode of the eleventh transistor, a second electrode of the eleventh transistor is connected to a first electrode of the twelfth transistor, and a second electrode of the twelfth transistor is connected to the low-level input terminal; and the signal output terminal is connected to the second electrode of the tenth transistor.

Preferably, the first signal conversion module includes a first inverter and a second inverter, wherein the first inverter includes a first transistor, a second transistor and a third transistor, where a gate electrode of the first transistor and a gate electrode of the third transistor are connected to the start signal input terminal, a gate electrode of the second transistor is connected to the clock signal terminal, the first transistor is a P-type transistor, the third transistor is an N-type transistor, a first electrode of the first transistor is connected to the high-level input terminal, a second electrode of the first transistor is connected to a first electrode of the second transistor, a second electrode of the second transistor is connected to a first electrode of the third transistor, and a second electrode of the third transistor is connected to the low-level input terminal, where the second transistor is a P-type transistor, and an output terminal of the first inverter is the second electrode of the second transistor;

the second inverter includes a fourth transistor, a fifth transistor and a sixth transistor, where the fourth transistor is a P-type transistor, and the fifth and sixth transistors are N-type transistors;

a first electrode of the fourth transistor is connected to the high-level input terminal, a second electrode of the fourth transistor is connected to a first electrode of the fifth transistor, a second electrode of the fifth transistor is connected to a first electrode of the sixth transistor, and a second electrode of the sixth transistor is connected to the low-level input terminal; and a gate electrode of the fifth transistor is connected to the output terminal of the first inverter, and gate electrodes of the fourth and sixth transistors are connected to the clock signal terminal, where an output terminal of the second inverter is the second electrode of the fourth transistor, and the fifth transistor has a width-to-length ratio larger than that of the third transistor.

Preferably, the second signal conversion module includes a third inverter and a fourth inverter, wherein the third inverter includes a seventh transistor, an eighth transistor and a ninth transistor, the seventh transistor is a P-type transistor, and the eighth and ninth transistors are N-type transistors;

a gate electrode of the seventh transistor and a gate electrode of the ninth transistor are connected to the output terminal of the first signal conversion module, and a gate electrode of the eighth transistor is connected to the clock signal terminal;

a first electrode of the seventh transistor is connected to the high-level input terminal, a second electrode of the seventh transistor is connected to a first electrode of the eighth transistor, a second electrode of the eighth transistor is connected to a first electrode of the ninth transistor, and a second electrode of the ninth transistor is connected to the low-level input terminal;

the fourth inverter includes a tenth transistor and a twelfth transistor, where the tenth transistor is a P-type transistor, and the twelfth transistor is an N-type transistor;

gate electrodes of the tenth and twelfth transistors are connected to the output terminal of the third inverter, a first electrode of the tenth transistor is connected to the high-level input terminal, a second electrode of the tenth transistor is connected to a first electrode of the twelfth transistor, a second electrode of the twelfth transistor is connected to the low-level input terminal, and the signal output terminal is connected to the second electrode of the tenth transistor.

Preferably, the sixth transistor has a width-to-length ratio larger than that of any one selected from the third transistor, the eighth transistor and the ninth transistor.

Preferably, both the fifth transistor and the sixth transistor have a width-to-length ratio of 40:1, and the third, eighth and ninth transistors all have a width-to-length ratio of 10:1.

As another aspect of the present invention, there is provided a shift register including a plurality of cascaded shift register cells, the shift register cell being the above-mentioned shift register cell provided by the present invention.

As still another aspect of the present invention, there is provided a gate driving circuit including a shift register, a high-level signal line, an odd clock signal line, an even clock signal line and a low-level signal line, wherein the shift register is the above-mentioned shift register provided by the present invention, the high-level signal line is connected to the high-level input terminal, the low-level signal line is connected to the low-level input terminal, the odd clock signal line is connected to the clock signal terminals of the shift register cells in odd stages, and the even clock signal line is connected to the clock signal terminals of the shift register cells in even stages.

As still another aspect of the present invention, there is provided a display device including a gate driving circuit, the gate driving circuit being the above-mentioned gate driving circuit provided by the present invention.

The shift register cell provided by the present invention only needs a single-phase clock signal to perform control, thereby simplifying the structure of the shift register cell and reducing the power consumption thereof. The display device using the shift register cell provided by the present invention can be implemented in a narrow-bezel design and can achieve low power consumption.

BRIEF DESCRIPTION OF THE DRAWINGS

The accompanying drawings, which constitute a part of the specification, are provided for further understanding of the present invention, and for explaining the present invention together with the following specific implementations, but not intended to limit the present invention, in which.

REFERENCE NUMERALS

100: first signal conversion module; 200: second signal conversion module; 110: first inverter; 120: second inverter; 210: third inverter; 220: fourth inverter; T1: first transistor; T2: second transistor; T3: third transistor; T4: fourth transistor; T5: fifth transistor; T6: sixth transistor; T7: seventh transistor; T8: eighth transistor; T9: ninth transistor; T10: tenth transistor; T11: eleventh transistor; T12: twelfth transistor.

DETAILED DESCRIPTION OF THE EMBODIMENTS

To make those skilled in the art better understand the technical solutions of the present invention, the present invention will be further described in detail below in conjunction with the accompanying drawings and specific implementations.

Figure 1:
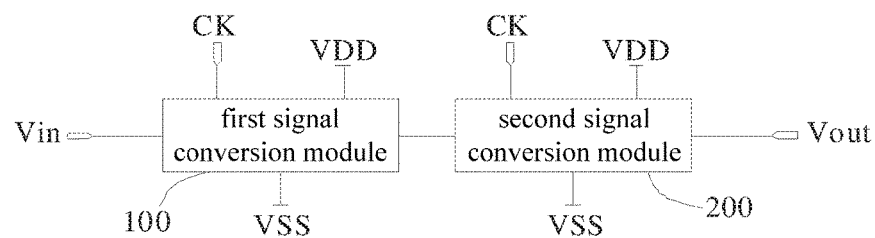
FIG. 1 is a block diagram of a shift register cell provided by the present invention.

As shown in FIG. 1, as an aspect of the present invention, there is provided a shift register cell, which comprises a start signal input terminal Vin, a clock signal terminal CK, a high-level input terminal VDD, a low-level input terminal VSS and a signal output terminal Vout, and further comprises a first signal conversion module 100 and a second signal conversion module 200. An input terminal of the first signal conversion module 100 is connected to the start signal input terminal Vin, an output terminal of the first signal conversion module 100 is connected to an input terminal of the second signal conversion module 200, and an output terminal of the second signal conversion module 200 is connected to the signal output terminal Vout. The first signal conversion module 100 is further connected to the clock signal terminal CK, the high-level input terminal VDD and the low-level input terminal VSS, respectively. The second signal conversion module 200 is further connected to the clock signal terminal CK, the high-level input terminal VDD and the low-level input terminal VSS, respectively, wherein one of a high-level signal inputted from the high-level input terminal VDD and a low-level signal inputted from the low-level input terminal VSS is an active signal, and the other is an inactive signal, and a clock signal is inputted from the clock signal terminal CK.

In a preprocessing stage (i.e., $t_0$ stage in FIGS. 3 and 5) where the clock signal is at a first level and the start signal is an active signal, an inactive signal may be outputted to the second signal conversion module 200 by the first signal conversion module 100, and an inactive signal may be outputted by the second signal conversion module 200 based on the inactive signal outputted by the first signal conversion module 100 and the clock signal.

In a first signal writing stage (i.e., $t_1$ stage in FIGS. 3 and 5) where the clock signal is at a second level and the start signal is an active signal, an inactive signal may be outputted to the second signal conversion module 200 by the first signal conversion module 100, and an inactive signal may be outputted by the second signal conversion module 200 based on the inactive signal outputted by the first signal conversion module 100 and the clock signal.

In a second signal writing stage (i.e., $t_2$ stage in FIGS. 3 and 5) where the clock signal is at the first level and the start signal is an active signal, an active signal is outputted to the second signal conversion module 200 by the first signal conversion module 100, and an inactive signal is outputted by the second signal conversion module 200 based on the active signal outputted by the first signal conversion module 100 and the clock signal.

In a first output stage (i.e., $t_3$ stage in FIGS. 3 and 5) where the clock signal is at the second level and the start signal is an inactive signal, an active signal is outputted to the second signal conversion module 200 by the first signal conversion module 100, and an active signal is outputted by the second signal conversion module 200 based on the active signal outputted by the first signal conversion module 100 and the clock signal.

In a second output stage (i.e., $t_4$ stage in FIGS. 3 and 5) where the clock signal is at the first level and the start signal is an inactive signal, an inactive signal is outputted to the second signal conversion module 200 by the first signal conversion module 100, and an active signal is outputted by the second signal conversion module 200 based on the inactive signal outputted by the first signal conversion module 100 and the clock signal.

It can be easily understood that the first level is different from the second level. In the case where the first level is a high level, the second level is a low level; and in the case where the first level is a low level, the second level is a high level. The levels of the "active signal" and the "inactive signal" depend on the type of the thin film transistor(s) in the display region of the display device which uses the above shift register cell, where the so-called active signal refers to a signal capable of turning on the thin film transistor in the display region of the display device, and the so-called inactive signal refers to a signal capable of turning off the thin film transistor in the display region of the display device.

After the above five stages finish, a shifting operation on an input signal is completed. It can be seen from the above description that, the shift register cell provided by the present invention only needs a single-phase clock signal to perform control, thereby simplifying the structure of the shift register cell and reducing the power consumption thereof. The display device using the shift register cell provided by the present invention can be implemented in a narrow-bezel design and can achieve low power consumption.

As an implementation of the present invention, the first signal conversion module 100 may be one of a positive-active latch and a negative-active latch, and the second signal conversion module 200 may be the other. For example, the first signal conversion module 100 is a positive-active latch, and the second signal conversion module 200 is a negative-active latch. In this case, the first level is a high level and the second level is a low level. When the clock signal inputted from the clock signal terminal CK is at the first level, the first signal conversion module 100 is in a transparent mode and the second signal conversion module 200 is in a holding mode, and when the clock signal is at the second level, the first signal conversion module 100 is in a holding mode and the second signal conversion module 200 is in a transparent mode.

It should be understood by those skilled in the art that, when the latch module is in the transparent mode, an output signal of the latch module is the same as an input signal thereof, and when the latch module is in the holding mode, the latch module maintains the output signal in the previous stage to be constant.

When the first signal conversion module 100 is in the transparent mode, the output signal of the first signal conversion module 100 is the same as the input signal inputted thereto, and when the first signal conversion module 100 is in the holding mode, the current output signal is the same as the output signal in the previous stage. Similarly, when the second signal conversion module 200 is in the transparent mode, the output signal of the second signal conversion module 200 is the same as the input signal inputted thereto, and when the second signal conversion module 200 is in the holding mode, it maintains the output signal in the previous stage to be constant.

In the present invention, the pulse width of the input signal is larger than that of the clock signal, and the duration of the input signal at a high level is equal to the time of one period of the clock signal.

When the input signal is an active signal and the clock signal is at the second level, the first signal conversion module 100 is in the holding mode, and thus the first signal conversion module 100 outputs an inactive signal. The second signal conversion module 200 is in the transparent mode since the clock signal is at the second level, and thus the second signal conversion module 200 may output the same signal as the inactive signal outputted by the first signal conversion module 100.

When the input signal is an active signal and the clock signal is at the first level, the first signal conversion module 100 is in the transparent mode, and thus the first signal conversion module 100 outputs the same signal as the input signal, both of which are active signals. The second signal conversion module 200 is in the holding mode since the clock signal is at the first level, and thus the signal outputted by the second signal conversion module 200 is still the inactive signal in the previous stage.

When the input signal is an inactive signal and the clock signal is at the second level, the first signal conversion module 100 is in the holding mode and may maintain the active signal in the previous stage. The second signal conversion module 200 is in the transparent mode since the clock signal is at the second level, and may output the same signal as the signal inputted thereto, thereby outputting an active signal.

It also can be seen from the above description that, the first and second signal conversion modules 100 and 200 in the shift register cell provided by the present invention constitute a master-slave edge-triggered flip-flop, and thus the influence of the duty cycle of the clock signal on the output signal is eliminated, and an effective and stable output signal may be obtained. In addition, the duration of active signal of the output signal is only relative to the period of the clock signal, which effectively avoids the disadvantageous effect of overlapping of the clock signals having multiple phases in the prior art.

In the case where the thin film transistor(s) in the display region of the display device is a P-type transistor, the active signal is a low-level signal, and in the case where the thin film transistor(s) in the display region of the display device is an N-type transistor, the active signal is a high-level signal.

In the implementations provided by the present invention, the active signal is a high-level signal and the inactive signal is a low-level signal.

In addition, in the present invention, the values of the first and second levels are not particularly specified, and the specific values of the first and second levels depend on the type of transistors used in the first and second signal conversion modules.

In the present invention, the first and second signal conversion modules 100 and 200 are not limited to any particular structure, as long as the first and second signal conversion modules 100 and 200 can constitute a master-slave edge-triggered flip-flop by connecting in series with each other and achieve the above function of the shift register cell.

Figure 2:
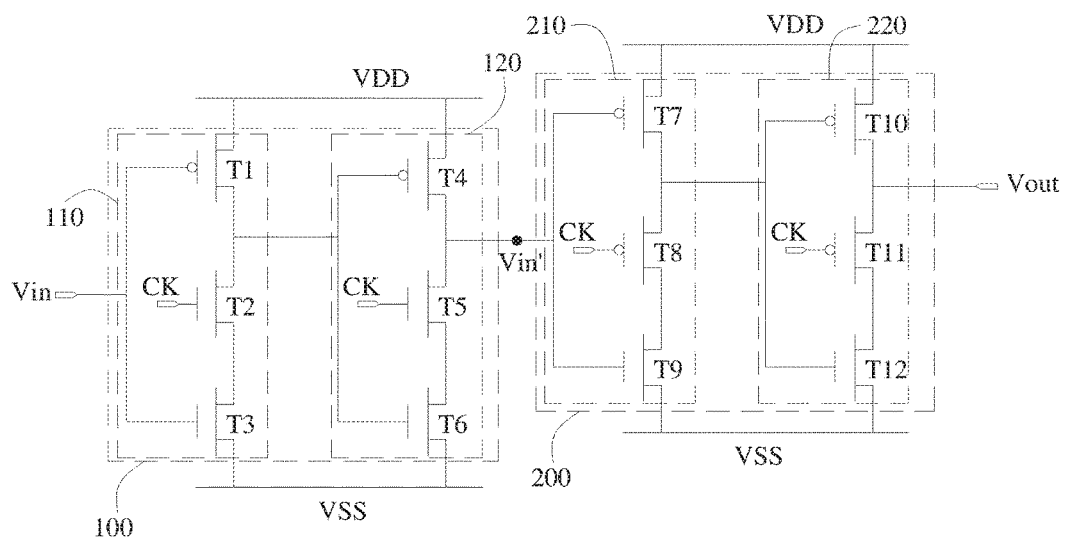
FIG. 2 is a circuit diagram of an implementation of the shift register cell provided by the present invention.

As an implementation of the present invention, as shown in FIG. 2, the first signal conversion module 100 includes first and second inverters 110 and 120 in series with each other, and when the clock signal inputted from the clock signal terminal CK is a first-level signal, the first inverter 110 may invert the start signal inputted thereto and the second signal conversion module 200 may invert a signal outputted from the first inverter 110. In the embodiment illustrated in FIG. 2, the first level is a high level and the second level is a low level.

Correspondingly, the second signal conversion module 200 includes third and fourth inverters 210 and 220 in series with each other, and when the clock signal inputted from the clock signal terminal CK is the second-level signal, the third inverter 210 may invert a signal outputted from the second inverter 120, and the fourth signal conversion module 220 may invert a signal outputted from the third inverter 210.

When the clock signal is at the first level, a first inverting operation is performed on the signal inputted from the start signal input terminal Vin by the first inverter 110, and the signal subjected to the first inverting operation is sent to the second inverter 120. A second inverting operation is then performed on the signal subjected to the first inverting operation by the second inverter 120, that is, the level of the signal after the second inverting operation is the same as that of the original input signal, thereby achieving the transparent mode of the first signal conversion module 100. When the clock signal is at the second level, the first inverter 110 does not perform the inverting operation (i.e., the first inverter 110 maintains the output in the previous stage), and the second inverter 120 does not perform the inverting operation (i.e., the second inverter 120 maintains the output in the previous stage) either, so that the first signal conversion module 100 can be in the holding mode.

When the clock signal is at the first level, the third and fourth inverters 210 and 220 do not perform the inverting operations, so that the second signal conversion module 200 can be in the holding mode. When the clock signal is at the second level, a first inverting operation may be performed on the signal outputted by the second inverter by the third inverter 210, and the signal subjected to the first inverting operation is sent to the fourth inverter 220. A second inverting operation may be performed on the signal subjected to the first inverting operation by the fourth inverter 220, that is, the level of the signal after the second inverting operation is the same as that of the original input signal, thereby achieving the transparent mode of the second signal conversion module 200.

In the present invention, the above inverters, including the first, second, third and fourth inverters, are not limited to any specific structure.

As an implementation of the present invention, as shown in FIG. 2, the first inverter 110 includes a first transistor T1, a second transistor T2 and a third transistor T3, where the first transistor T1 is a P-type transistor, and the second and third transistors T2 and T3 are N-type transistors. Gate electrodes of the first and third transistors T1 and T3 are both connected to the start signal input terminal Vin, a gate electrode of the second transistor T2 is connected to the clock signal terminal CK, a first electrode of the first transistor T1 is connected to the high-level input terminal VDD, a second electrode of the first transistor T1 is connected to a first electrode of the second transistor T2, a second electrode of the second transistor T2 is connected to a first electrode of the third transistor T3, and a second electrode of the third transistor T3 is connected to the low-level input terminal VSS. The first electrode of the second transistor T2 is the output terminal of the first inverter 110.

In the case where the first inverter 110 has the above structure, the first-level signal should be a high-level signal, and the second-level signal should be a low-level signal. The first inverter having the above structure includes both P-type transistors and N-type transistors, and thus may be fabricated in CMOS process and has advantages of fast speed, high integration degree and excellent anti-interference performance and the like.

When the clock signal inputted from the clock signal terminal CK is at a high level, the second transistor T2 is turned on. Since the first transistor T1 is a P-type transistor and the third transistor T3 is an N-type transistor, it is inevitable that one of the first and third transistors T1 and T3 is turned on and the other is turned off, regardless whether the input signal is at a high level or a low level. In the case where the start signal is at a high level, the first transistor T1 is turned off and the third transistor T3 is turned on, and thus the first electrode of the second transistor T2 is electrically connected to the low-level input terminal VSS, so a low-level signal is outputted, that is, the start signal is inverted.

In the case where the start signal is at a low level, the third transistor T3 is turned off and the first transistor T1 is turned on, and thus the first electrode of the second transistor T2 is electrically connected to the high-level input terminal VDD, so a high-level signal is outputted, that is, the start signal is inverted.

When the clock signal is at a low level, the second transistor T2 is turned off. In this case, if the input signal is at a high level, although the third transistor T3 may be turned on, the output in the previous stage is maintained at the first electrode of the second transistor T2 due to the turned-off state of the second transistor T2; and, if the input signal is at a low level, the first transistor T1 is turned on, and a high-level signal is outputted by the first inverter 110.

In addition, FIG. 2 also illustrates a specific implementation of the second inverter. Specifically, the second inverter 120 includes a fourth transistor T4, a fifth transistor T5 and a sixth transistor T6, wherein the fourth transistor T4 is a P-type transistor, and the fifth transistor T5 and the sixth transistor T6 are N-type transistors.

A first electrode of the fourth transistor T4 is connected to the high-level input terminal VDD, a second electrode of the fourth transistor T4 is connected to a first electrode of the fifth transistor T5, a second electrode of the fifth transistor T5 is connected to a first electrode of the sixth transistor T6, and a second electrode of the sixth transistor T6 is connected to the low-level input terminal VSS.

A gate electrode of the fifth transistor T5 is connected to the clock signal terminal CK, a gate electrode of the fourth transistor T4 and a gate electrode of the sixth transistor T6 are connected to the output terminal of the first inverter 110, and the second electrode of the fourth transistor T4 is an output terminal of the second inverter 120.

In the implementation as shown in FIG. 2, when the clock signal inputted from the clock signal terminal CK is at a high level, the fifth transistor T5 is turned on. In this case, if the first inverter 110 outputs a high-level signal, the fourth transistor T4 is turned off and the sixth transistor T6 is turned on, and thus the first electrode of the fifth transistor T5 is electrically connected to the low-level input terminal, so a low-level signal is outputted; if the first inverter 110 outputs a low-level signal, the sixth transistor T6 is turned off and the fourth transistor T4 is turned on, and thus the first electrode of the fifth transistor T5 is electrically connected to the high-level input terminal VDD, so a high-level signal is outputted.

In the implementation as shown in FIG. 2, when the clock signal inputted from the clock signal terminal CK is at a low level, the fifth transistor T5 is turned off. In this case, if the first inverter 110 outputs a high-level signal, the fourth transistor T4 is turned off and the sixth transistor T6 is turned on, and thus the second inverter 120 maintains the output level (in the present embodiment, a low level) in the previous stage due to the turned-off state of the fifth transistor T5; if the first inverter 110 outputs a low-level signal, the fourth transistor T4 is turned on, so the second inverter 120 may output a high-level signal.

In addition, FIG. 2 also illustrates an implementation of the third inverter 210. The third inverter 210 includes a seventh transistor T7, an eighth transistor T8 and a ninth transistor T9, wherein the seventh transistor T7 and the eighth transistor T8 are P-type transistors, and the ninth transistor T9 is an N-type transistor.

A gate electrode of the seventh transistor T7 and a gate electrode of the ninth transistor T9 are both connected to the output terminal of the second inverter 120, and a gate electrode of the eighth transistor T8 is connected to the clock signal terminal CK. A first electrode of the seventh transistor T7 is connected to the high-level input terminal VDD, a second electrode of the seventh transistor T7 is connected to a first electrode of the eighth transistor T8, a second electrode of the eighth transistor T8 is connected to a first electrode of the ninth transistor T9, and a second electrode of the ninth transistor T9 is connected to the low-level input terminal VSS. The second electrode of the seventh transistor T7 is an output terminal of the third inverter 210

In the implementation as shown in FIG. 2, when the clock signal inputted from the clock signal terminal CK is at a low level, the eighth transistor T8 is turned on. If the first signal conversion module 100 outputs a high-level signal, the seventh transistor T7 is turned off and the ninth transistor T9 is turned on, and thus the first electrode of the eighth transistor T8 is electrically connected to the low-level input terminal VSS through the ninth transistor T9, so the third inverter 210 outputs a low-level signal. If the first signal conversion module 100 outputs a low-level signal, the seventh transistor T7 is turned on and the ninth transistor T9 is turned off, and thus the first electrode of the eighth transistor T8 is electrically connected to the high-level input terminal VDD through the seventh transistor T7, so the third inverter outputs a high-level signal.

When the clock signal inputted from the clock signal terminal CK is at a high level, the eighth transistor T8 is turned off. In this case, if the first signal conversion module 100 outputs a high-level signal, the ninth transistor T9 is turned on and the seventh transistor T7 is turned off. The level of the signal in the previous stage is maintained at the first electrode of the eighth transistor T8 due to the turned-off state of the eighth transistor T8. When the clock signal inputted from the clock signal terminal CK is at a low level, the eighth transistor T8 is turned on. In this case, if the signal outputted from the output terminal Vin' of the first signal conversion module 100 is at a high level, the ninth transistor T9 is turned on and the seventh transistor T7 is turned off, and thus the first electrode of the eighth transistor T8 is electrically connected to the low-level input terminal VSS through the ninth transistor T9, so a low-level signal is outputted; if the signal outputted from the output terminal Vin' of the first signal conversion module 100 is at a low level, the seventh transistor T7 is turned on and the ninth transistor T9 is turned off, and thus the first electrode of the eighth transistor T8 is electrically connected to the high-level input terminal VDD, so a high-level signal is outputted.

FIG. 2 also illustrates a specific implementation of the fourth inverter 220. Specifically, the fourth inverter 220 includes a tenth transistor T10, an eleventh transistor T11 and a twelfth transistor T12, wherein the tenth transistor T10 and the eleventh transistor T11 are P-type transistors, and the twelfth transistor T12 is an N-type transistor. Gate electrodes of the tenth and twelfth transistors T10 and T12 are connected to the output terminal of the third inverter 210, and a gate electrode of the eleventh transistor T11 is connected to the clock signal terminal CK. A first electrode of the tenth transistor T10 is connected to the high-level input terminal VDD, a second electrode of the tenth transistor T10 is connected to a first electrode of the eleventh transistor T11, a second electrode of the eleventh transistor T11 is connected to a first electrode of the twelfth transistor T12, and a second electrode of the twelfth transistor T12 is connected to the low-level input terminal VSS. The signal output terminal Vout is connected to the second electrode of the tenth transistor T10.

When the clock signal inputted from the clock signal terminal CK is at a high level, the eleventh transistor T11 is turned off. In this case, if the third inverter 210 outputs a high-level signal, the tenth transistor T10 is turned off and the twelfth transistor T12 is turned on, and the level in the previous stage is maintained at the first electrode of the eleventh transistor T11; if the third inverter outputs a low-level signal, the tenth transistor T10 is turned on and the twelfth transistor T12 is turned off, and thus the signal output terminal Vout is electrically connected to the high-level input terminal VDD, so a high-level signal is outputted by the shift register cell, that is, the signal outputted by the third inverter 210 is inverted.

When the clock signal inputted from the clock signal terminal CK is at a low level, the eleventh transistor T11 is turned on. If the third inverter 210 outputs a high-level signal, the twelfth transistor T12 is turned on, and thus the first electrode of the eleventh transistor T11 is electrically connected to the low-level input terminal VSS, so a low-level signal is outputted. If the third inverter outputs a low-level signal, the tenth transistor T10 is turned on, and thus the first electrode of the eleventh transistor T11 is electrically connected to the high-level input terminal VDD, so a high-level signal is outputted.

Hereinafter, operating principles of the specific implementation as shown in FIG. 2 will be described in conjunction with FIGS. 2 and 3. In such implementation, the first-level signal is a high-level signal and the second-level signal is a low-level signal.

In the implementation as shown in FIG. 2, the second transistor T2 of the first inverter 110 is an N-type transistor, and the output terminal of the first inverter 110 is the first electrode of the second transistor T2. The gate electrode of the fifth transistor T5 of the second inverter 120 is connected to the clock signal terminal CK, and the gate electrodes of the fourth and sixth transistors T4 and T6 of the second inverter 120 are both connected to the output terminal of the first inverter 110. The fourth inverter 220 includes the eleventh transistor T11, the tenth transistor T10 and the twelfth transistor T12. The first and second inverters 110 and 120 are connected in series to form the first signal conversion module 100, and the third and fourth inverters 210 and 220 are connected in series to form the second signal conversion module 200. In such implementation, the first-level signal is a high-level signal and the second-level signal is a low-level signal, and the active signal is a high-level signal.

Figure 3:
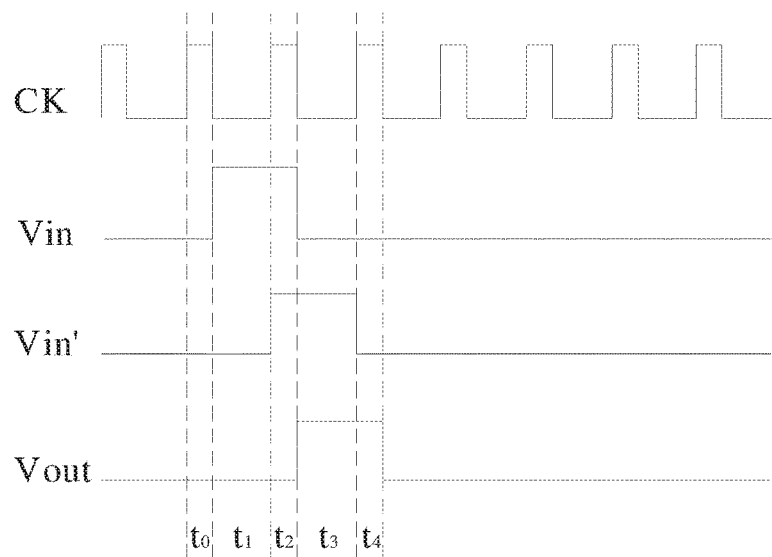
FIG. 3 is an operating timing diagram of the shift register cell as shown in FIG. 2.

As illustrated in FIG. 3, the duration of the start signal, inputted from the start signal input terminal Vin, at a high level is equal to the time of one period of the clock signal.

In the stage of $t_0$, since the clock signal is at a high level, the second transistor T2 is turned on, the fifth transistor T5 is turned on, the eighth transistor T8 is turned off and the eleventh transistor T11 is turned off. Since the start signal is at a low level, the first transistor T1 is turned on and the third transistor T3 is turned off, so the first inverter 110 outputs a high-level signal. The sixth transistor T6 of the second inverter is driven to be on by the high-level signal outputted by the first inverter 110, and the fourth transistor T4 is driven to be off, so the second inverter 120 outputs a low-level signal. At this time, the first signal conversion module 100 is in the transparent mode, that is, the input and output signals of the first signal conversion module 100 are both low-level signals. Since the signal outputted from the output terminal Vin' of the first signal conversion module 100 is at a low level, the seventh transistor T7 of the third inverter 210 is turned on and the ninth transistor T9 is turned off, so the third inverter 210 outputs a high-level signal, which drives the tenth transistor T10 of the fourth inverter 220 to be off and the twelfth transistor T12 to be on, and thus the output signal in the previous stage is maintained at the signal output terminal Vout, that is, the holding mode of the second signal conversion module 200 is achieved.

In the stage of $t_1$, since the clock signal is at a low level, the second transistor T2 of the first inverter 110 is turned off and the fifth transistor T5 of the second inverter 120 is turned off. Since the start signal is at a high level, the first transistor T1 is turned off and the third transistor T3 is turned on, so the high-level signal in the stage of $t_0$ is maintained at the first electrode of the second transistor T2, which drives the sixth transistor T6 to be on and the fourth transistor T4 to be off, and thus the signal outputted by the fifth transistor T5 is the signal in the stage of $t_0$, that is, the first signal conversion module is in the holding mold in which the signal in the previous stage is maintained. The signal outputted from the output node Vin' of the first signal conversion module 100 is at a low level. Since the clock signal is at a low level during the stage of $t_1$, the eighth transistor T8 of the third inverter 210 is turned on, and the signal outputted from the output node Vin' of the first signal conversion module 100 to the third inverter 210 is inverted to a high-level signal. At this time, the eleventh transistor T11 of the fourth inverter 220 is turned on, and thus the signal inputted to the fourth inverter 220 is inverted, by the fourth inverter, to a low-level signal, so the low-level signal is outputted from the signal output terminal Vout, thereby achieving the transparent mode of the second signal conversion module 200.

In the stage of $t_2$, since the clock signal is at a high level, the second transistor T2 of the first inverter 110 is turned on and the fifth transistor T5 of the second inverter 120 is turned on, so that both the first and second inverters 110 and 120 may perform the inverting operations. Since the start signal is at a high level, the first inverter 110 outputs a low-level signal and the second inverter 120 outputs a high-level signal, thereby achieving the transparent mode of the first signal conversion module 100. Since the clock signal is at a high level, the eighth transistor T8 of the third inverter 210 and the eleventh transistor T11 of the fourth inverter 220 are both turned off. In this case, since the signal outputted from the output node Vin' of the first signal conversion module 100 is a high-level signal, the ninth transistor T9 of the third inverter 210 is turned on and the seventh transistor T7 of the third inverter 210 is turned off, so the high-level signal in the previous stage is maintained at the output terminal of the third inverter 210, which drives the tenth transistor T10 of the fourth inverter to be off and the twelfth transistor T12 of the fourth inverter to be on, and thus the fourth inverter outputs the low-level signal in the previous stage, thereby achieving the holding mode of the second signal conversion module 200.

In the stage of $t_3$, since the clock signal is at a low level, the second transistor T2 of the first inverter 110 and the fifth transistor T5 of the second inverter 120 are turned off. Since the start signal is at a low level, the first transistor T1 is turned on and the first inverter 110 outputs a high-level signal, and thus the sixth transistor T6 is driven to be on and the fourth transistor T4 is driven to be off, so the second inverter 120 maintains the high-level signal in the previous stage. At this time, the first signal conversion module 100 is in the holding mode. Since the clock signal is at a low level, the eighth transistor T8 of the third inverter 210 and the eleventh transistor T11 of the fourth inverter 220 are turned on. Since the input signal of the third inverter 210 is at a high level, the third inverter 210 outputs a low-level signal and the fourth inverter outputs a high-level signal, thereby achieving the transparent mode of the second signal conversion module 200.

In the stage of $t_4$, since the clock signal is at a high level, the second transistor T2 of the first inverter 110 is turned on and the fifth transistor T5 of the second inverter 120 is turned on. Since the start signal is at a high level, the first transistor T1 is turned on and the third transistor T3 is turned off, so the first inverter 110 outputs a high-level signal; the sixth transistor T6 of the second inverter is turned on and the fourth transistor T4 is turned off, and thus the second inverter 120 outputs a low-level signal, so the first signal conversion module 100 is in the transparent mode. Since the clock signal is a high-level signal, the eighth transistor T8 and the eleventh transistor T11 are turned off. The first signal conversion module 100 outputs a low-level signal, and therefore, the seventh transistor T7 is turned on and the ninth transistor T9 is turned off, so the third inverter 210 outputs a high-level signal, which drives the twelfth transistor T12 of the fourth inverter to be on and the tenth transistor T10 to be off, and thus the fourth inverter 220 may output the high-level signal in the previous stage, and the second signal conversion module 200 is in the holding mode.

Hereto, a shifting operation is completed, in which the start signal inputted through the signal input terminal Vin is shifted to the output signal outputted from the signal output terminal Vout.

Figure 4:
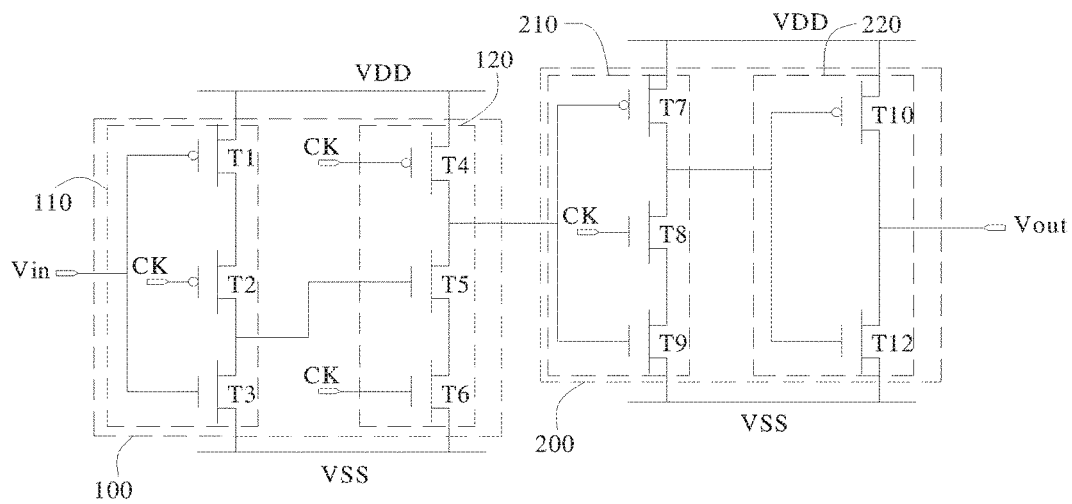
FIG. 4 is a circuit diagram of another implementation of the shift register cell provided by the present invention.

In addition to the implementation as shown in FIG. 2, the first signal conversion module 100 may also be implemented as shown in FIG. 4.

Specifically, as shown in FIG. 4, the first signal conversion module 100 includes a first inverter 110 and a second inverter 120.

The first inverter 110 includes a first transistor T1, a second transistor T2 and a third transistor T3, where the first transistor T1 is a P-type transistor, and the second and third transistors T2 and T3 are N-type transistors. A gate electrode of the first transistor T1 and a gate electrode of the third transistor T3 are both connected to the start signal input terminal Vin, a gate electrode of the second transistor T2 is connected to the clock signal terminal, a first electrode of the first transistor T1 is connected to the high-level input terminal VDD, a second electrode of the first transistor T1 is connected to a first electrode of the second transistor T2, a second electrode of the second transistor T2 is connected to a first electrode of the third transistor T3, and a second electrode of the third transistor T3 is connected to the low-level input terminal VSS. The second electrode of the second transistor T2 is an output terminal of the first inverter.

The second inverter 120 includes a fourth transistor T4, a fifth transistor T5 and a sixth transistor T6, where the fourth transistor T4 is a P-type transistor, and the fifth and sixth transistors T5 and T6 are N-type transistors.

A first electrode of the fourth transistor T4 is connected to the high-level input terminal VDD, a second electrode of the fourth transistor T4 is connected to a first electrode of the fifth transistor T5, a second electrode of the fifth transistor T5 is connected to a first electrode of the sixth transistor T6, and a second electrode of the sixth transistor T6 is connected to the low-level input terminal VSS.

A gate electrode of the fifth transistor T5 is connected to the output terminal of the first inverter, and gate electrodes of the fourth and sixth transistors T4 and T6 are connected to the clock signal terminal.

The second electrode of the fourth transistor T4 is an output terminal of the second inverter, and the fifth transistor T5 has a width-to-length ratio larger than that of the third transistor T3.

The width-to-length ratios of the fifth and sixth transistors T5 and T6 are larger than the width-to-length ratios of the third, eighth and ninth transistors T3, T8 and T9, which makes the discharging rate of the first electrode of the fifth transistor T5 is faster than that of the first electrode of the third transistor T3 and that of the first electrode of the eighth transistor T8. Such arrangement is beneficial to the output signal, which may be stabilized without glitch. For example, the fifth and sixth transistors T5 and T6 may both have a width-to-length ratio of 40:1, and the third, eighth and ninth transistors T3, T8 and T9 may all have a width-to-length ratio of 10:1, but the present invention is not limited hereto.

Preferably, the second signal conversion module 200 includes a third inverter 210 and a fourth inverter 220.

The third inverter 210 includes a seventh transistor T7, an eighth transistor T8 and a ninth transistor T9. The seventh transistor T7 is a P-type transistor, and the eighth and ninth transistors T8 and T9 are N-type transistors.

Gate electrodes of the seventh and ninth transistors T7 and T9 are connected to the output terminal of the first signal conversion module 100, and a gate electrode of the eighth transistor T8 is connected to the clock signal terminal CK.

A first electrode of the seventh transistor T7 is connected to the high-level input terminal VDD, a second electrode of the seventh transistor T7 is connected to a first electrode of the eighth transistor T8, a second electrode of the eighth transistor T8 is connected to a first electrode of the ninth transistor T9, and a second electrode of the ninth transistor T9 is connected to the low-level input terminal VSS.

The fourth inverter 220 includes a tenth transistor T10 and a twelfth transistor T12, where the tenth transistor T10 is a P-type transistor, and the twelfth transistor T12 is an N-type transistor.

Gate electrodes of the tenth and twelfth transistors T10 and T12 are both connected to the output terminal of the third inverter 210, a first electrode of the tenth transistor T10 is connected to the high-level input terminal VDD, a second electrode of the tenth transistor T10 is connected to a first electrode of the twelfth transistor T12, a second electrode of the twelfth transistor T12 is connected to the low-level input terminal VSS, and the signal output terminal is connected to the second electrode of the tenth transistor T10.

Figure 5:
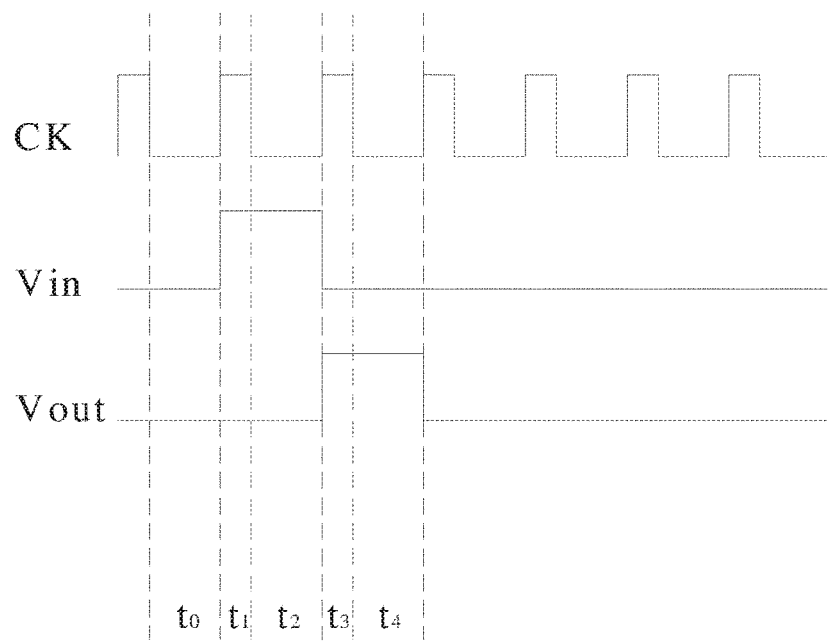
FIG. 5 is an operating timing diagram of the shift register cell as shown in FIG. 4.

Hereinafter, the specific operating principle of the shift register cell in the second implementation of the present invention will be described in conjunction with FIGS. 4 and 5. The shift register cell in the second implementation of the present invention only needs eleven transistors, and the structure thereof is further simplified.

In the implementation as shown in FIG. 4, the first-level signal is a low-level signal and the second-level signal is a high-level signal.

In the stage of $t_0$ where the start signal is at a low level and the clock signal is at a low level, the second transistor T2 is turned on, the first transistor T1 is turned on and the third transistor T3 is turned off, so the first inverter 110 outputs a high-level signal. The fifth transistor T5 of the second inverter 120 is driven to be on by the high-level signal outputted by the first inverter 110, and, at this time, the fourth transistor T4 of the second inverter 120 is turned on and the sixth transistor T6 is turned off, so the second inverter 120 outputs a high-level signal. Since the signal outputted from the output terminal of the first signal conversion module 100 is at a high level, the seventh transistor T7 of the third inverter 210 is turned off and the ninth transistor T9 is turned on, and because the eighth transistor T8 is turned off, the high-level signal in the previous stage is maintained at the first electrode of the eighth transistor T8, which drives the tenth transistor T10 of the fourth inverter 220 to be off and the twelfth transistor T12 to be on, so a low-level signal is outputted from the signal output terminal Vout.

In the stage of $t_1$ where the start signal is at a high level and the clock signal is at a high level, the second transistor T2 of the first inverter 110 is turned off and the eighth transistor T8 of the third inverter 210 is turned on. Since the start signal is a high-level signal, the third transistor T3 of the first inverter 110 is turned on and the first transistor T1 is turned off, so the first inverter 110 outputs a low-level signal. Since the width-to-length ratios of the fifth and sixth transistors T5 and T6 are larger than the width-to-length ratios of the third, eighth and ninth transistors T3, T8 and T9, the discharging rates of the fifth and sixth transistors T5 and T6 are faster than the discharging rates of the third, eighth and ninth transistors T3, T8 and T9. Therefore, it is discharged to a low level ahead at the gate electrode of the seventh transistor T7, and thus the seventh transistor T7 is driven to be on and the ninth transistor T9 is driven to be off, and the second electrode of the seventh transistor T7 is electrically connected to the high-level input terminal VDD through the first electrode of the seventh transistor T7 so as to output a high-level signal to the fourth inverter 220, and then the twelfth transistor T12 of the fourth inverter 220 is driven to be on, such that the signal output terminal Vout is electrically connected to the low-level input terminal VSS through the twelfth transistor T12, and a low-level signal is outputted.

In the stage of $t_2$ where the start signal is at a high level and the clock signal is at a low level, the second transistor T2 is turned on and the third transistor T3 is turned on in the first inverter 110, and thus the first inverter 110 outputs a low-level signal, which drives the fifth transistor T5 of the second inverter 120 to be off. The fourth transistor T4 is turned on, so the second inverter 120 outputs a high-level signal so as to drive the ninth transistor T9 to be on, the seventh transistor T7 to be off and the eighth transistor T8 to be off, and thus the high-level signal in the stage of $t_1$ is maintained at the first electrode of the eighth transistor T8, such that the tenth transistor T10 is driven to be off and the twelfth transistor T12 is driven to be on, and the signal output terminal Vout is electrically connected to the low-level input terminal VSS through the twelfth transistor T12 and a low-level signal is outputted.

In the stage of $t_3$ where the start signal is at a low level and the clock signal is at a high level, the first transistor T1 is turned on, the second transistor T2 is turned off and the third transistor T3 is turned off, so the low-level signal in the previous stage is outputted at the output terminal of the first inverter. The fifth transistor T5 is turned off, the fourth transistor T4 is turned off and the sixth transistor T6 is turned on, and thus the high-level in the previous stage is maintained at the first electrode of the fifth transistor T5, such that the ninth transistor T9 is driven to be on. Since the eighth transistor T8 is turned on and the seventh transistor T7 is turned off, the third inverter outputs a low-level signal, which drives the tenth transistor T10 to be on and the twelfth transistor T12 to be off, such that the signal output terminal Vout is electrically connected to the high-level input terminal VDD through the tenth transistor T10, and thus a high-level signal is outputted.

In the stage of $t_4$ where the start signal is at a low level and the clock signal is also at a low level, the first and second transistors T1 and T2 are both turned on, and the third transistor T3 is turned off, so the first inverter 110 outputs a high-level signal. The fifth transistor T5 is turned on, the fourth transistor T4 is turned on and the sixth transistor T6 is turned off, and thus the second inverter 120 outputs a high-level signal. Since the ninth transistor T9 is turned on, the seventh transistor T7 is turned off and the eighth transistor T8 is turned off, the low-level signal in the previous stage is maintained at the first electrode of the eighth transistor T8, which drives the tenth transistor T10 to be on and the twelfth transistor T12 to be off, such that the signal output terminal Vout is electrically connected to the high-level input terminal VDD through the tenth transistor T10, and thus a high-level signal is outputted.

Hereto, a shifting operation is completed, in which the start signal inputted through the signal input terminal Vin is shifted to the output signal outputted from the signal output terminal Vout.

As another aspect of the present invention, there is provided a shift register including a plurality of cascaded shift register cells, the shift register cell being the above-mentioned shift register cell provided by the present invention.

Since the shift register cell has a simple structure, the shift register provided by the present invention also has a simple structure.

As still another aspect of the present invention, there is provided a gate driving circuit including a shift register, a high-level signal line, an odd clock signal line, an even clock signal line and a low-level signal line, wherein the shift register is the above-mentioned shift register provided by the present invention, the high-level signal line is connected to the high-level input terminal, the low-level signal line is connected to the low-level input terminal, the odd clock signal line is connected to the clock signal terminals of the shift register cells in odd stages, and the even clock signal line is connected to the clock signal terminals of the shift register cells in even stages.

As still another aspect of the present invention, there is provided a display device including a gate driving circuit, the gate driving circuit being the above-mentioned gate driving circuit provided by the present invention.

It can be understood that the foregoing implementations are merely exemplary implementations used for describing the principle of the present invention, but the present invention is not limited thereto. Those of ordinary skill in the art may make various variations and improvements without departing from the spirit and essence of the present invention, and these variations and improvements shall fall into the protection scope of the present invention.

What is claimed is:

1. A shift register cell, comprising a start signal input terminal, a clock signal terminal, a high-level input terminal, a low-level input terminal, a signal output terminal, a first signal conversion module and a second signal conversion module, wherein an input terminal of the first signal conversion module is connected to the start signal input terminal, an output terminal of the first signal conversion module is connected to an input terminal of the second signal conversion module, and an output terminal of the second signal conversion module is connected to the signal output terminal, the first signal conversion module is further connected to the clock signal terminal, the high-level input terminal and the low-level input terminal, respectively, the second signal conversion module is further connected to the clock signal terminal, the high-level input terminal and the low-level input terminal, respectively, one of a high-level signal inputted from the high-level input terminal and a low-level signal inputted from the low-level input terminal is an active signal, and the other is an inactive signal, and a clock signal is inputted from the clock signal terminal;

in a preprocessing stage where the clock signal is at a first level and the start signal is an inactive signal, an inactive signal is outputted to the second signal conversion module by the first signal conversion module, and an inactive signal is outputted by the second signal conversion module based on the inactive signal outputted by the first signal conversion module and the clock signal;

in a first signal writing stage where the clock signal is at a second level and the start signal is an active signal, an inactive signal is outputted to the second signal conversion module by the first signal conversion module, and an inactive signal is outputted by the second signal conversion module based on the inactive signal outputted by the first signal conversion module and the clock signal;

in a second signal writing stage where the clock signal is at the first level and the start signal is an active signal, an active signal is outputted to the second signal conversion module by the first signal conversion module, and an inactive signal is outputted by the second signal conversion module based on the active signal outputted by the first signal conversion module and the clock signal;

in a first output stage where the clock signal is at the second level and the start signal is an inactive signal, an active signal is outputted to the second signal conversion module by the first signal conversion module, and an active signal is outputted by the second signal conversion module based on the active signal outputted by the first signal conversion module and the clock signal; and in a second output stage where the clock signal is at the first level and the start signal is an inactive signal, an inactive signal is outputted to the second signal conversion module by the first signal conversion module, and an active signal is outputted by the second signal conversion module based on the inactive signal outputted by the first signal conversion module and the clock signal.

2. The shift register cell according to claim 1, wherein the first signal conversion module is one of a positive-active latch and a negative-active latch, and the second signal conversion module is the other, and wherein when the clock signal is at the first level, the first signal conversion module is in a transparent mode and the second signal conversion module is in a holding mode; and when the clock signal is at the second level, the first signal conversion module is in a holding mode and the second signal conversion module is in a transparent mode.

3. The shift register cell according to claim 2, wherein the first signal conversion module includes first and second inverters in series with each other, when the clock signal inputted from the clock signal terminal is a first-level signal, the start signal inputted to the first inverter is inverted, by the first inverter, and outputted to the second inverter, and the signal outputted by the first inverter is inverted by the second inverter; and the second signal conversion module includes third and fourth inverters in series with each other, when the clock signal inputted from the clock signal terminal is a second-level signal, the signal outputted by the second inverter is inverted by the third inverter and outputted to the fourth inverter, and the signal outputted by the third inverter is inverted by the fourth inverter.

4. The shift register cell according to claim 3, wherein the first inverter includes a first transistor, a second transistor and a third transistor, the first transistor being a P-type transistor, and the second and third transistors being N-type transistors;
   a gate electrode of the first transistor and a gate electrode of the third transistor are both connected to the start signal input terminal, a gate electrode of the second transistor is connected to the clock signal terminal, a first electrode of the first transistor is connected to the high-level input terminal, a second electrode of the first transistor is connected to a first electrode of the second transistor, a second electrode of the second transistor is connected to a first electrode of the third transistor, a second electrode of the third transistor is connected to the low-level input terminal, and the first electrode of the second transistor is an output terminal of the first inverter; and
   the first level is a high level, and the second level is a low level.

5. The shift register cell according to claim 3, wherein the second inverter includes a fourth transistor, a fifth transistor and a sixth transistor, the fourth transistor being a P-type transistor, and the fifth and sixth transistors being N-type transistors;
   a first electrode of the fourth transistor is connected to the high-level input terminal, a second electrode of the fourth transistor is connected to a first electrode of the fifth transistor, a second electrode of the fifth transistor is connected to a first electrode of the sixth transistor, a second electrode of the sixth transistor is connected to the low-level input terminal, a gate electrode of the fifth transistor is connected to the clock signal terminal, a gate electrode of the fourth transistor and a gate electrode of the sixth transistor are both connected to the output terminal of the first inverter, and the second electrode of the fourth transistor is an output terminal of the second inverter; and
   the first level is a high level, and the second level is a low level.

6. The shift register cell according to claim 3, wherein the third inverter includes a seventh transistor, an eighth transistor and a ninth transistor, the seventh and eighth transistors being P-type transistors, and the ninth transistor being an N-type transistor;
   a gate electrode of the seventh transistor and a gate electrode of the ninth transistor are both connected to the output terminal of the second inverter, and a gate electrode of the eighth transistor is connected to the clock signal terminal; a first electrode of the seventh transistor is connected to the high-level input terminal, a second electrode of the seventh transistor is connected to a first electrode of the eighth transistor, a second electrode of the eighth transistor is connected to a first electrode of the ninth transistor, a second electrode of the ninth transistor is connected to the low-level input terminal, and the second electrode of the seventh transistor is an output terminal of the third inverter; and
   the first level is a high level, and the second level is a low level.

7. The shift register cell according to claim 3, wherein the fourth inverter includes a tenth transistor, an eleventh transistor and a twelfth transistor, the tenth transistor and the eleventh transistor being P-type transistors, and the twelfth transistor being an N-type transistor;
   gate electrodes of the tenth and twelfth transistors are connected to the output terminal of the third inverter, and a gate electrode of the eleventh transistor is connected to the clock signal terminal; a first electrode of the tenth transistor is connected to the high-level input terminal, a second electrode of the tenth transistor is connected to a first electrode of the eleventh transistor, a second electrode of the eleventh transistor is connected to a first electrode of the twelfth transistor, a second electrode of the twelfth transistor is connected to the low-level input terminal, and the signal output terminal is connected to the second electrode of the tenth transistor; and
   the first level is a high level, and the second level is a low level.

8. The shift register cell according to claim 3, wherein the first inverter includes a first transistor, a second transistor and a third transistor, the first and second transistors being P-type transistors, and the second transistor being an N-type transistor;
   a gate electrode of the first transistor and a gate electrode of the third transistor are both connected to the start signal input terminal, a gate electrode of the second transistor is connected to the clock signal terminal, a first electrode of the first transistor is connected to the high-level input terminal, a second electrode of the first transistor is connected to a first electrode of the second transistor, a second electrode of the second transistor is connected to a first electrode of the third transistor, a second electrode of the third transistor is connected to the low-level input terminal, and the second electrode of the second transistor is an output terminal of the first inverter;
   the second inverter includes a fourth transistor, a fifth transistor and a sixth transistor, the fourth transistor being a P-type transistor, and the fifth and sixth transistors being N-type transistors;
   a first electrode of the fourth transistor is connected to the high-level input terminal, a second electrode of the fourth transistor is connected to a first electrode of the fifth transistor, a second electrode of the fifth transistor is connected to a first electrode of the sixth transistor, and a second electrode of the sixth transistor is connected to the low-level input terminal; a gate electrode of the fifth transistor is connected to the output terminal of the first inverter, gate electrodes of the fourth and sixth transistors are connected to the clock signal terminal, and the second electrode of the fourth transistor is an output terminal of the second inverter;
   wherein the fifth transistor has a width-to-length ratio larger than that of the third transistor; and
   wherein the first level is a high level, and the second level is a low level.

9. The shift register cell according to claim 8, wherein the sixth transistor has a width-to-length ratio larger than that of any one selected from the third transistor, the eighth transistor and the ninth transistor.

10. The shift register cell according to claim 9, wherein the fifth transistor and the sixth transistor both have a width-to-length ratio of 40:1, and the third, eighth and ninth transistors all have a width-to-length ratio of 10:1.

11. The shift register cell according to claim 3, wherein the third inverter includes a seventh transistor, an eighth transistor and a ninth transistor, the seventh transistor being a P-type transistor, and the eighth and ninth transistors being N-type transistors;

a gate electrode of the seventh transistor and a gate electrode of the ninth transistor are connected to the output terminal of the first signal conversion module, and a gate electrode of the eighth transistor is connected to the clock signal terminal; a first electrode of the seventh transistor is connected to the high-level input terminal, a second electrode of the seventh transistor is connected to a first electrode of the eighth transistor, a second electrode of the eighth transistor is connected to a first electrode of the ninth transistor, a second electrode of the ninth transistor is connected to the low-level input terminal, and the second electrode of the seventh transistor is an output terminal of the third inverter;

the fourth inverter includes a tenth transistor and a twelfth transistor, the tenth transistor being a P-type transistor, and the twelfth transistor being an N-type transistor;

gate electrodes of the tenth and twelfth transistors are connected to the output terminal of the third inverter, a first electrode of the tenth transistor is connected to the high-level input terminal, a second electrode of the tenth transistor is connected to a first electrode of the twelfth transistor, a second electrode of the twelfth transistor is connected to the low-level input terminal, and the signal output terminal is connected to the second electrode of the tenth transistor.

12. The shift register cell according to claim 11, wherein the sixth transistor has a width-to-length ratio larger than that of any one selected from the third transistor, the eighth transistor and the ninth transistor.

13. The shift register cell according to claim 12, wherein the fifth transistor and the sixth transistor both have a width-to-length ratio of 40:1, and the third, eighth and ninth transistors all have a width-to-length ratio of 10:1.

14. A shift register, including a plurality of cascaded shift register cells according to claim 1.

15. A gate driving circuit, including a shift register according to claim 14, a high-level signal line, an odd clock signal line, an even clock signal line and a low-level signal line, wherein the high-level signal line is connected to the high-level input terminal, the low-level signal line is connected to the low-level input terminal, the odd clock signal line is connected to the clock signal terminals of the shift register cells in odd stages, and the even clock signal line is connected to the clock signal terminals of the shift register cells in even stages.

16. A display device, including a gate driving circuit according to claim 15.

\* \* \* \* \*